(12) United States Patent
Yang et al.

(10) Patent No.: US 7,790,599 B2
(45) Date of Patent: Sep. 7, 2010

(54) METAL CAP FOR INTERCONNECT STRUCTURES

(75) Inventors: Chih-Chao Yang, Glenmont, NY (US); Ping-Chuan Wang, Hopewell Junction, NY (US); Yun-Yu Wang, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 448 days.

(21) Appl. No.: 11/734,958

(22) Filed: Apr. 13, 2007

(65) Prior Publication Data

US 2008/0254624 A1 Oct. 16, 2008

(51) Int. Cl.
*H01L 21/4763* (2006.01)
(52) U.S. Cl. ............... 438/618; 438/637; 257/E23.145
(58) Field of Classification Search .............. 438/618, 438/637, 641; 257/E23.145
See application file for complete search history.

(56) References Cited

U.S. PATENT DOCUMENTS

| | | | |
|---|---|---|---|
| 5,470,790 A * | 11/1995 | Myers et al. ............ 438/625 |
| 5,585,673 A | 12/1996 | Joshi et al. | |
| 5,695,810 A | 12/1997 | Dubin et al. | |
| 6,323,554 B1 | 11/2001 | Joshi et al. | |
| 6,342,733 B1 | 1/2002 | Hu et al. | |
| 6,706,625 B1 | 3/2004 | Sudijono et al. | |
| 2004/0113279 A1 | 6/2004 | Chen et al. | |
| 2007/0202689 A1 * | 8/2007 | Choi et al. ............ 438/637 |

* cited by examiner

*Primary Examiner*—Asok K Sarkar
*Assistant Examiner*—Julia Slutsker
(74) *Attorney, Agent, or Firm*—Ian D. MacKinnon (57) ABSTRACT

A structure and method of forming an improved metal cap for interconnect structures is described. The method includes forming an interconnect feature in an upper portion of a first insulating layer; depositing a dielectric capping layer over the interconnect feature and the first insulating layer; depositing a second insulating layer over the dielectric capping layer; etching a portion of the second insulating layer to form a via opening, wherein the via opening exposes a portion of the interconnect feature; bombarding the portion of the interconnect feature for defining a gauging feature in a portion of the interconnect feature; etching the via gauging feature for forming an undercut area adjacent to the interconnect feature and the dielectric capping layer; depositing a noble metal layer, the noble metal layer filling the undercut area of the via gauging feature to form a metal cap; and depositing a metal layer over the metal cap.

13 Claims, 9 Drawing Sheets

METAL CAP FOR INTERCONNECT STRUCTURES

BACKGROUND OF THE INVENTION

1. Technical Field

The present disclosure relates generally to interconnect structures formed in semiconductor devices. In particular, the present disclosure relates to a structure and methods of forming interconnect structures with improved metal caps.

2. Description of Related Art

Integrated circuit chips typically include two or more levels of conductive lines which are vertically spaced apart and separated by intermediate insulating layers. Interconnections are formed between the levels of conductive lines in the chip for providing, for example, high wiring density and good thermal performance. The interconnections are formed by means of lines and vias which are etched through the insulating layers separating the levels. The lines and vias are then filled with a metal (e.g. Cu) to form interconnect elements (i.e. via studs). A typical interconnect element includes metal vias running perpendicular to the semiconductor substrate and metal lines running parallel to the semiconductor substrate. This process results in multiple levels of conductor wiring interconnection patterns, having individual levels connected by via studs and operating to distribute signals among the various circuits on the chip.

Reliability concerns, such as electromigration, constitute a major and persistent difficulty encountered during interconnection formation. In particular, electromigration decreases the reliability of integrated circuits leading, for example, to the eventual loss of one or more connections and intermittent failure of the entire circuit. The electromigration concept is illustrated in FIGS. 1A-1D.

Figure 1A:
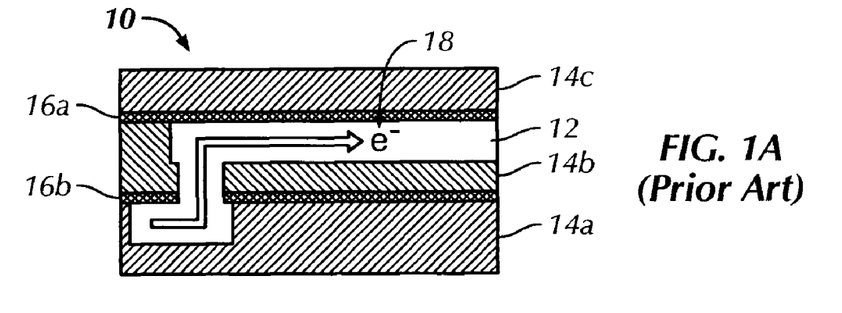
FIGS. 1A-1D illustrates a simplified cross-sectional view of a conventional metal interconnect structure formed on a semiconductor substrate illustrating the formation of voids inside a metal conductor.
Figure 1B:
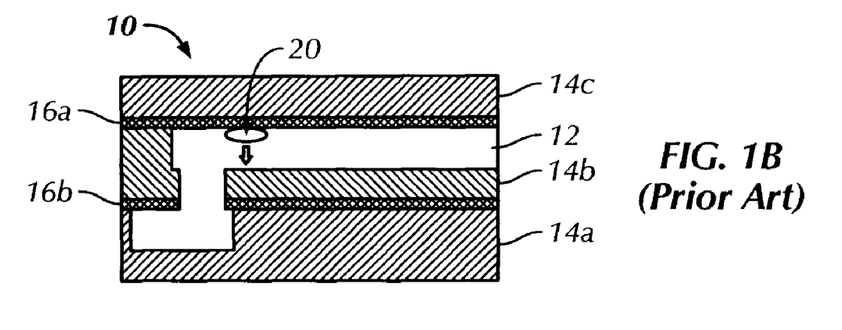
Figure 1C:
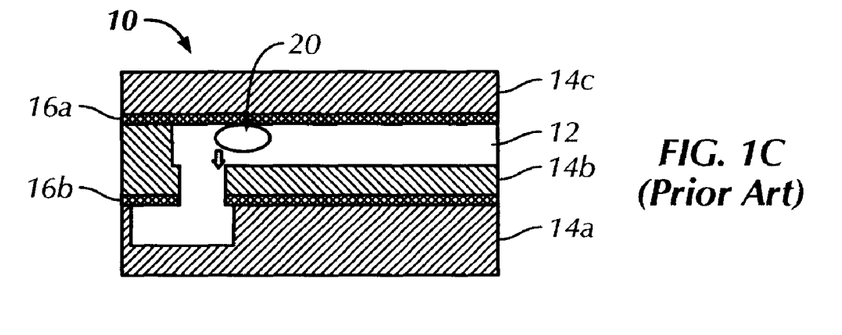
Figure 1D:
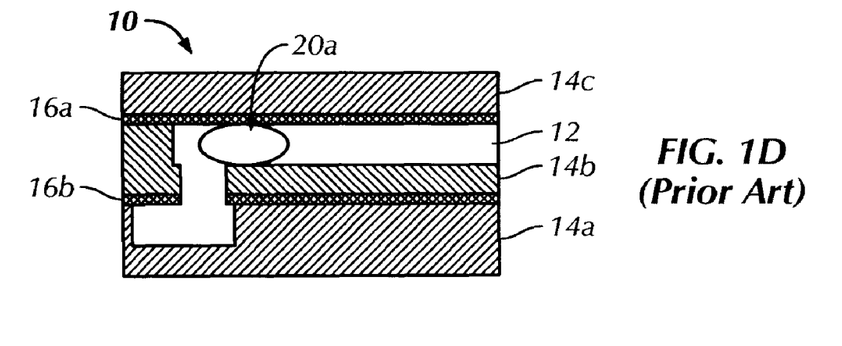

With reference to FIG. 1A, a semiconductor structure 10 is illustrated having a conventional metal interconnect structure 12 formed in insulating materials 14a, 14b and 14c. Dielectric caps 16a and 16b separate insulating material 14a, 14b and 14c from one another. Interconnect structure 12 includes a conductive metal such as Cu. Initially, (time t=0), a conductive electron 18 moves through diffusing Cu atoms. With reference to FIG. 1B, some of the momentum of moving electron 18 is transferred to an activated Cu ion causing the ion to move from its original position. Overtime (time t=1), this momentum causes enough Cu ions to move far enough from their original positions, thus forming void 20 in a top portion of interconnect structure 12. In FIG. 1C, at time t=2, void 20 nucleate causing growth toward the bottom of interconnect structure 12. With reference to FIG. 1D, overtime (at time t=3) this force knocks enough Cu atoms far enough from their original positions permitting void 20 to continue to grow until it crosses the metal interconnect 12 and develops a break or void 20a in interconnect structure 12, thus causing an open circuit.

As the structure size in integrated circuits decreases, the practical significance of the effect of electromigration increases. That is, with increasing miniaturization, the probability of failure due to electromigration increases in very-large-scale integration (VLSI) and ultra-large-scale integration (ULSI) circuits because both the power density and the current density increase in these applications. In fact, electromigration has long been identified as the major metal failure mechanism. Electromigration not only needs to be overcome during the process development period in order to qualify the process, but it also persist through the life time of the chip.

Several solutions to the problems caused by electromigration have been proposed in advanced semiconductor manufacturing processes. For example, copper (Cu) has replaced aluminium as the interconnect material of choice because, despite its greater fragility in the fabrication process, it possesses superior conductivity and is intrinsically less susceptible to electromigration. In addition, it has been demonstrated that replacing the Cu/dielectric interface with Cu/metal interface can enhance the electromigration resistance by more than 100 times. Thus, metal cap is generally preferred over conventional dielectric cap for better electromigration resistance.

Figure 2A:
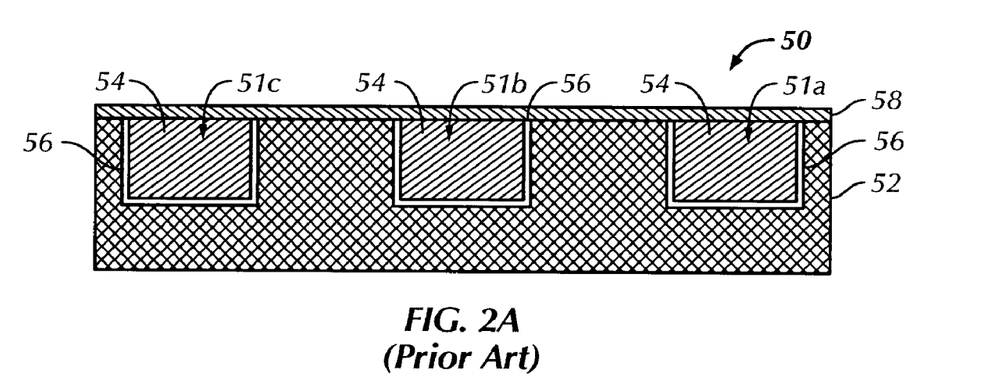
FIG. 2A illustrates a simplified cross-sectional diagram of a dielectric cap deposition process for interconnect structures found in the prior art.

FIG. 2A illustrate a prior art interconnect structure having a dielectric cap on the wiring structures. In particular, FIG. 2A describes an interconnect structure 50 including a dielectric material 52 having conductive features 51A, 51B and 51C embedded therein. The conductive features 51A, 51B and 51C include a conductive metal, such as Cu 54 which is located within an opening provided in the dielectric material 52. The Cu 54 is separated from the dielectric material 52 by a diffusion barrier 56. A dielectric capping layer 58 is deposited on the upper exposed surface of each conductive feature (i.e., Cu 54) during a deposition process. Typically, capping layer 58 includes Si3N4, SiC or SiC(N,H). As discussed and shown in FIGS. 1A-1D, the Cu 54/dielectric 58 interface is a high electromigration diffusion path, and this interconnect structure containing this Cu/dielectric interface is a reliability concern on electromigration related failures.

Figure 2B:
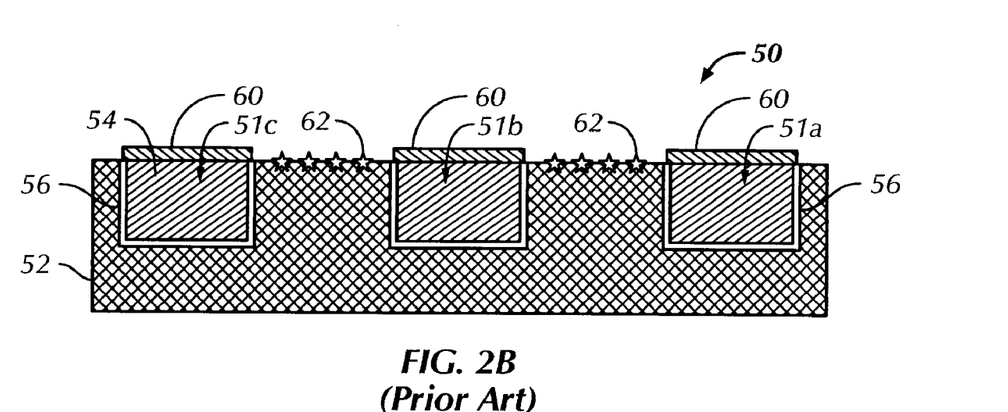
FIG. 2B illustrates a simplified cross-sectional diagram of a selective metal cap deposition process for interconnect structures found in the prior art.

FIG. 2B illustrate another prior art from a selective metal cap deposition process on interconnect or wiring structures. In particular, and similarly to FIG. 1, FIG. 2B shows a prior art interconnect structure 50 including a dielectric material 52 having conductive features 51A, 51B and 51C embedded therein. The conductive features 51A, 51B and 51C include a conductive material 54 which is located within an opening provided in the dielectric material 52. The conductive material 54 is separated from the dielectric material 52 by a diffusion barrier 56. A metallic capping layer 60 is deposited on the upper exposed surface of each conductive feature (i.e., conductive material 54) during a selective deposition process. Capping layer 60 may include a selectively deposited metal, such as CoWP resulting on a wiring structure having a Cu/metal interference with superior adhesion strength when compared to the typically used Cu/dielectric interface (illustrated in FIG. 2A) and having enhanced electromigration resistance. Despite the improvement in electromigration resistance, however, the use of metallic capping layer 60 provides an interconnect structure with metallic residue 62 present on the surface of the dielectric material, as illustrated in FIG. 2B. This problematic metallic residue 62 forms during the formation of metallic capping layer 60. The presence of the metallic residue 62 between each of the conductive features hinders or degrades the reliability of the prior art interconnect structure and has delayed using metallic capping layers for the last three generations. In addition, uniformity is very difficult to control when working with multiple chips often resulting in electrical shorts between adjacent interconnects is a concern for selective metal cap application.

Figure 3A:
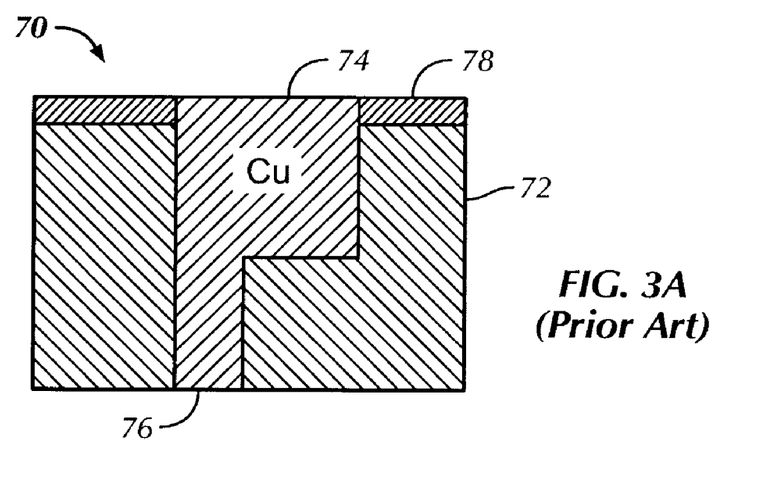
FIGS. 3A-3C illustrate simplified cross-sectional diagrams of another prior art metal cap deposition process for interconnect structures.
Figure 3B:
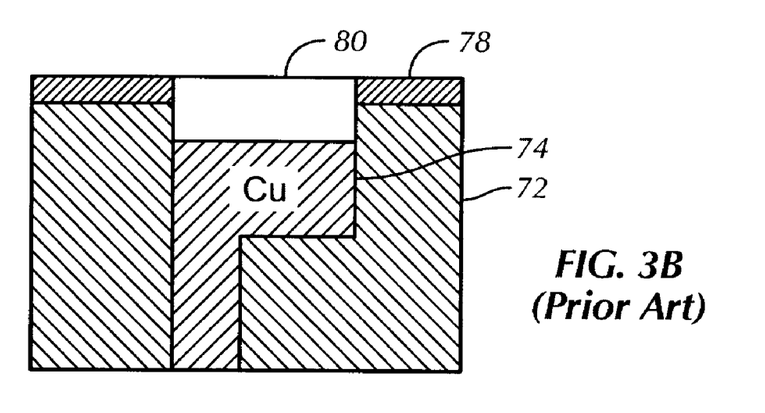
Figure 3C:
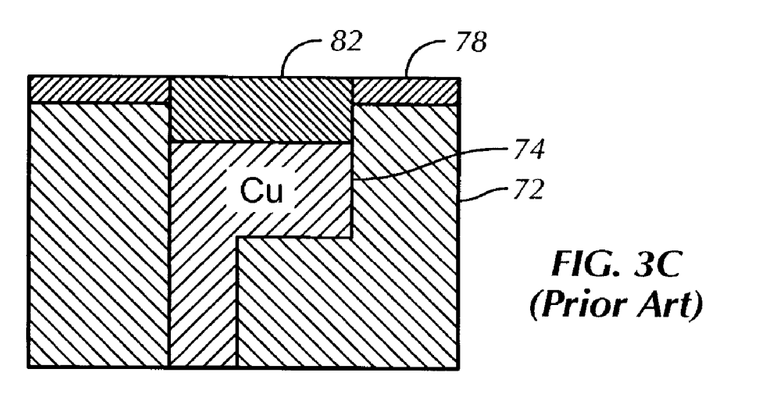

FIGS. 3A-3C illustrate yet another proposed method of forming a metal cap in interconnect or wiring structures for enhancing electromigration resistance. In this particular embodiment of the prior art, a metal cap via Cu recess process has been proposed. FIG. 3A illustrates a prior art interconnect structure 70 that includes a dielectric material 72 having a conductive material 74 (i.e. Cu) embedded within via opening 76 provided in the dielectric material 72. A first chemical mechanical planarization (CMP) is conducted following the deposition of conductive material 74. A hardmask layer 78 is deposited prior to forming via opening 76 using conventional lithographic techniques. Conductive material 74 may be separated from the dielectric material 72 by a diffusion barrier (not shown). A wet etching technique by acids including, for example, HF, H2SO4, HCl or H3NO4, is used to remove a top portion of conductive material 74 for forming a recesses region 80, as shown in FIG. 3B. Next, a metallic capping layer 82 is deposited, filling recess region 80. A second CMP is then carried out following the deposition of metallic capping layer 82, resulting in the structure shown in FIG. 3C. In addition to problems of non-uniformity from the mentioned recess process, a high cost is a big concern for manufacturing metal cap via Cu recess process since it involves two CMP processes.

Therefore, a need exist for a novel method of forming metal caps in interconnect structures which overcomes the shortcomings of the prior art and which is compatible with existing integration schemes.

SUMMARY OF THE INVENTION

The present disclosure is directed to a structure and methods of forming interconnect structures. In one embodiment, a method of fabricating an interconnect structure is described. The method includes forming an interconnect feature in an upper portion of a first insulating layer; depositing a dielectric capping layer over the interconnect feature and the first insulating layer; depositing a second insulating layer over the dielectric capping layer; etching a portion of the second insulating layer to form a via opening, the via opening exposes a portion of the interconnect feature; bombarding the portion of the interconnect feature for defining a gauging feature in a portion of the interconnect feature; etching the via gauging feature for forming an undercut area adjacent to the interconnect feature and the dielectric capping layer; depositing a noble metal layer, the noble metal layer filling the undercut area of the via gauging feature to form a metal cap; and depositing a metal layer over the metal cap. In one embodiment, the depositing a metal layer forms dual damascene structure over the metal cap. The interconnect element includes a conductive metal selected from a group consisting of Cu, Al, W and alloys thereof. In addition, the insulating layer is formed on includes a dielectric layer, wherein the dielectric layer includes a dielectric constant of at most 4.0 and further wherein the dielectric layer includes a thickness ranging from about 200 nm to about 450 nm.

The via gauging feature includes a plurality of opposing planes extending into the interconnect element. In addition, the via gauging feature is formed by etching the dielectric capping layer to define at least one opening, wherein the at least one opening exposes a portion of the interconnect element; and bombarding the exposed portion of the interconnect element. The bombarding includes a gaseous physical bombardment. Moreover, the gaseous physical bombardment includes an Argon bombardment.

The at least one undercut area is formed by conducting an isotropic etching process. In one embodiment, the at least one etched undercut area extends along a portion of interconnect element. Alternatively, the at least one etched undercut feature extends along an entire surface of the interconnect element. The metal cap protrudes outwardly between the interconnect element and the dielectric capping layer. The metal layer may include a noble metal selected from a group consisting of Ru, Ir, Rh, Pt and alloys thereof.

In another embodiment, an interconnect structure is described. The structure includes a first interconnect element formed in a first insulating layer; and a second interconnect element formed in a second insulating layer, the second interconnect element being connected to the first interconnected element by way of a via gauging feature formed on the first interconnect element; and a metal cap formed on the via gauging feature, wherein the metal cap is embedded between the first and the second interconnect elements, and further wherein the metal cap includes at least one portion protruding outwardly from the via gauging feature. The interconnect structure further includes a dielectric capping layer formed between the first and the second insulating layers. The via gauging feature includes a plurality of opposing planes extending into the interconnect element. In addition, the at least one outwardly protruding portion extends along a portion of a surface of the interconnect element. Alternatively, the at least one outwardly protruding portion extends substantially along a surface of the interconnect element. In addition, the metal cap includes a noble metal selected from a group consisting of Ru, Ir, Rh, Pt and alloys thereof. The interconnect element includes a conductive metal selected from a group consisting of Cu, Al, W and alloys thereof.

Other features of the presently disclosed structure and method of forming interconnect structures will become apparent from the following detailed description taken in conjunction with the accompanying drawing, which illustrate, by way of example, the presently disclosed structure and method.

BRIEF DESCRIPTION OF THE DRAWINGS

The features of the presently disclosed structure and method of forming interconnect structures will be described hereinbelow with references to the figures, wherein.

DETAILED DESCRIPTION

Referring now to the drawing figures, wherein like references numerals identify identical or corresponding elements, an embodiment of the presently disclosed method of forming an improved interconnect structure will be disclosed in detail. In the following description, numerous specific details are set forth, such as particular structures, components, materials, dimensions, processing steps and techniques, in order to provide a thorough understanding of the present invention. However, it will be appreciated by one skilled in the art that the invention may be practiced without these specific details. In other instances, well-known structures or processing steps have not been described in detail to avoid obscuring the invention. Thus, the materials described herein are employed to illustrate the invention in one application and should not be construed as limiting.

FIGS. 4-10 illustrate new and improved interconnect structures with metal cap embedded therewithin. In one embodiment, a vertical sublithographic structure is provided including a first interconnect element formed in a first insulating material layer and a second interconnect element formed in a second insulating material layer. The second interconnect element includes at least one line configured for connecting with a portion of the first interconnect element. The line includes a via gauging feature and a metal cap formed in the via gauging feature. Thus, the metal cap is embedded between the first and the second interconnects features. In addition, the metal cap includes an overhang portion protruding outwardly from the via gauging feature, the protrusion extending longitudinally along the first interconnect element, in a manner described in detail hereinbelow.

Figure 4:
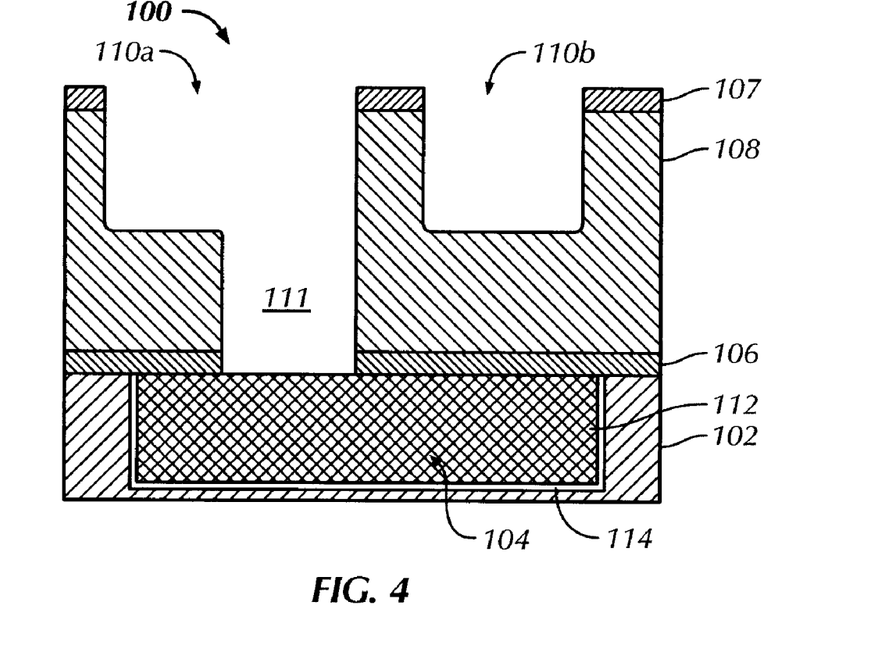
FIGS. 4-10 illustrate simplified cross-sectional views of progressive stages of a method of forming interconnect structures, in accordance with one embodiment of the present disclosure.

With initial reference to FIG. 4, an interconnect structure is illustrated and is designated generally as interconnect structure 100. Interconnect structure 100 includes generally a first insulating layer 102 (e.g. dielectric layer) formed on a base semiconductor substrate (not shown) and containing therewithin an interconnect element 104. A dielectric capping layer 106 is provided over first insulating layer 102 and interconnect element 104. In one embodiment, dielectric capping layer 106 includes a thickness ranging from about 15 nm to about 55 nm. A second insulating layer 108 is disposed on the upper surface of dielectric capping layer 106. A hard mask layer 107 is deposited on a top surface of second insulating layer 108 prior to the formation of interconnect openings 110A and 110B using conventional techniques. Interconnect openings 110A and 110B are etched and formed in second dielectric layer 108 using well known etching methods, such as, for example, reactive ion etch (RIE). Interconnect opening 110A includes a contact via 111 extending through second dielectric layer 108 and dielectric capping layer 106 for exposing a portion of interconnect element 104.

The base semiconductor substrate may include any of several semiconductor materials well known in the art, such as, for example, a bulk silicon substrate, silicon-on-insulator (SOI) and silicon-on-sapphire (SOS). Other non-limiting examples include silicon, germanium, silicon-germanium alloy, silicon carbide, silicon-germanium carbide alloy and compound (i.e. III-V and II-VI) semiconductor materials. Non-limiting examples of compound semiconductor materials include gallium arsenide, indium arsenide and indium phosphide semiconductor material. Typically, the base semiconductor substrate may be about, but is not limited to, several hundred microns thick. For example, the base semiconductor substrate may include a thickness ranging from about 0.5 mm to about 1.5 mm.

In one embodiment, first insulating layer 102 is a dielectric layer which includes a dielectric constant, k, of about 4.0 or less and a thickness ranging from about 200 nm to about 450 nm. Insulating layer 102 may include any interlevel or intralevel dielectric, and may be porous or non-porous. Suitable materials include, but are not limited to, SiN, SiO2, Si3N4, SiCOH, SiLK (a polyarylene ether available from Dow Chemical Corporation), JSR (a spin-on silicon-carbon contained polymer material available from JSR corporation), silesquioxanes, C doped oxides (i.e. organosilicates) that include atoms of Si, C, O, and/or H, thermosetting polyarylene ethers, etc. or layers thereof. It is understood, however, that other materials having different dielectric constant and/or thickness may be employed. Second insulating layer 108 may include the same or different dielectric material as that of first dielectric material 102. Moreover, the processing techniques and thickness ranges described hereinabove with respect to first insulating layer 102 are also applicable to second insulating layer 108.

Interconnect element 104 is formed using conventional lithographic techniques. Interconnect element 104 includes a conductive metal 112 and a highly resistive diffusion barrier 114 to prevent conductive metal 112 from diffusing. Diffusion barrier 114 is deposited using atomic layer deposition (ALD), or alternatively, a chemical vapor deposition (CVD) or physical sputter deposition (PVD) may be used. In one embodiment, diffusion barrier 114 includes a thickness ranging from about 4 nm to about 40 nm. Conductive metal 112 may be selected from a material including, for example, Cu, Al, W, TiN, TaN, Ta, Mo, their alloys, and any suitable conductive material. Highly resistive diffusion barrier 114 may be selected from a material including Ta, TaN, TiN, Ru, Ru(Ta), Ru(TaN), W, WN, or any other barrier material.

Dielectric capping layer 106 is formed through conventional deposition processes, such as, for example, CVD, ALD, plasma enhanced chemical vapor deposition (PECVD), etc. Dielectric capping layer 106 may include any of several materials well known in the art, for example, Si3N4, SiC, SiO2, and SiC (N, H) (i.e., nitrogen or hydrogen doped silicon carbide), etc.

Hardmask layer 107 may be formed using conventional deposition processes, such as, for example, CVD, atomic layer deposition (ALD), plasma enhanced chemical vapor deposition (PECVD), etc. Hardmask layer 107 may be include any material capable of functioning as an etch stop layer, such as, for example, silicon nitride (Si3N4) and silicon oxinitride (SiOxNy). In one embodiment, hardmask layer 107 includes a thickness ranging from about 5 nm to about 70 nm.

Figure 5:
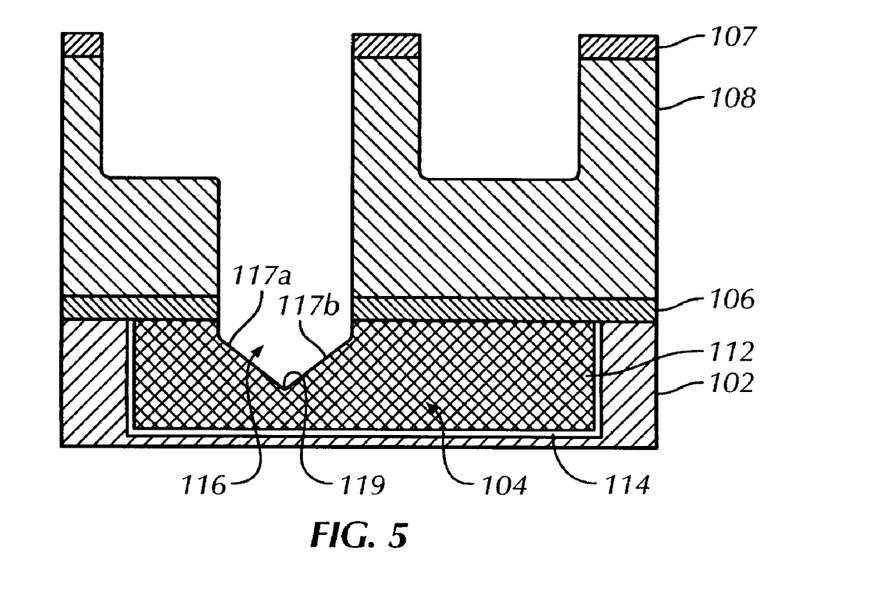

With reference to FIG. 5, a physical bombardment is performed in contact via 111 to form a via gauging feature 116 in the exposed portion of interconnect element 104. In particular, a physical Argon (Ar) bombardment is performed through contact via 111 for creating via gauging feature 116. During the sputtering process, the ionized gaseous is accelerated by means of electrical bias and is used to bombard the underneath exposed interconnect surface. Other physical bombardments are envisioned, including, for example, Xe, He, etc. Via gauging feature 116 includes opposing sides 117a and 117b which extend into interconnect element 104 to an end 119.

Figure 6:
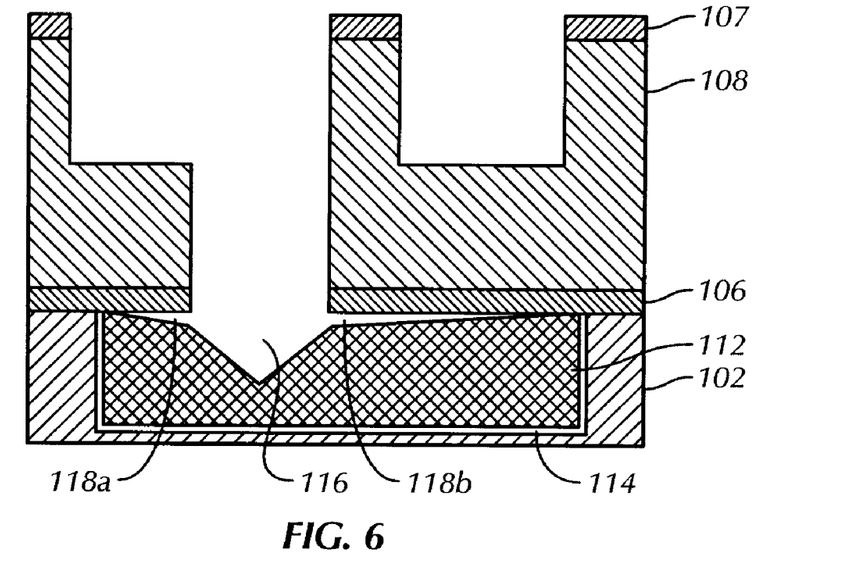

With reference to FIG. 6, an isotropic wet/dry etching is performed to create undercut areas 118a and 118b adjoining via gauging feature 116. In one embodiment, the isotropic wet/dry etching is accomplished using, for example, a diluted acid such as HF, H2SO4, HCl, HNO3, etc. Since the etching rate along the interface between conductive metal 112 and dielectric capping layer 106 is faster than the etching rate in via gauging feature 116, an undercut feature including undercut areas 118a and 118b is formed next to via gauging feature 116 and between the conductive metal 112 and dielectric capping layer 106, as illustrated by the figure.

Figure 7:
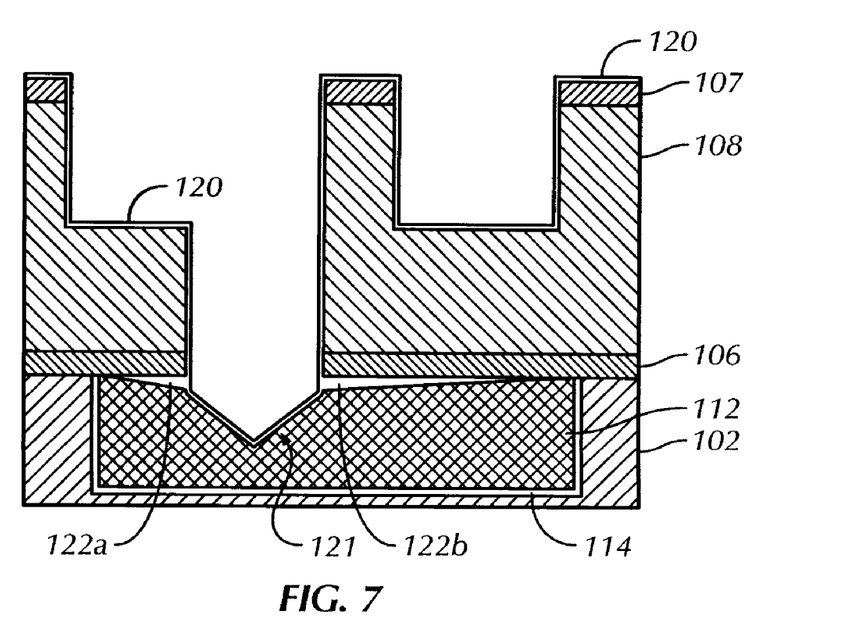

With reference to FIG. 7, a metal layer 120 is deposited over the structure using ALD or, alternatively, CVD techniques. Metal layer 120 fills undercut areas 118a, 118b thus forming metal cap 121 having portions 122a and 122b covering conductive metal 112. Elsewhere in the structure, noble metal layer 120 is a conformal layer having a thickness ranging from about 4 nm to about 40 nm. In one embodiment, metal layer 120 is a noble metal selected from a material including, for example, Ru, Ir, Rh, Pt, their alloys, and any suitable noble metal.

Figure 8:
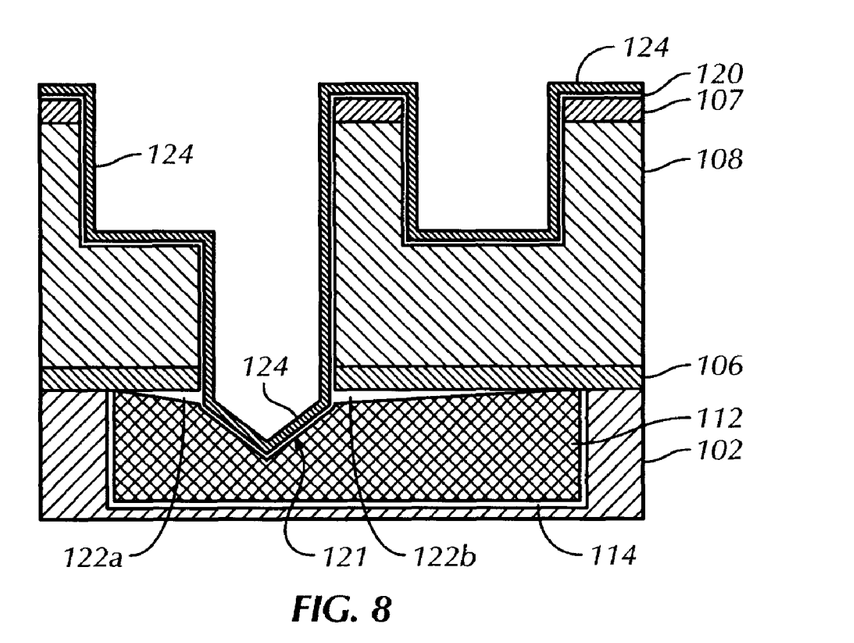

With reference to FIG. 8, a conventional process is followed to form liner layer 124. Liner 124 includes, for example, a conductive metal diffusion barrier and plating seed. In one embodiment, liner 124 includes a thickness ranging from about 4 nm to about 40 nm. Liner 124 is selected from a variety of materials including, for example, Ta, TaN, TiN, Ru, RuTa, RuTaN, W, WN, or any other barrier material. Plating seed is selected from a material including, for example, Cu, Cu(Al), Cu(Ir), Cu(Ru) and similar materials.

Figure 9:
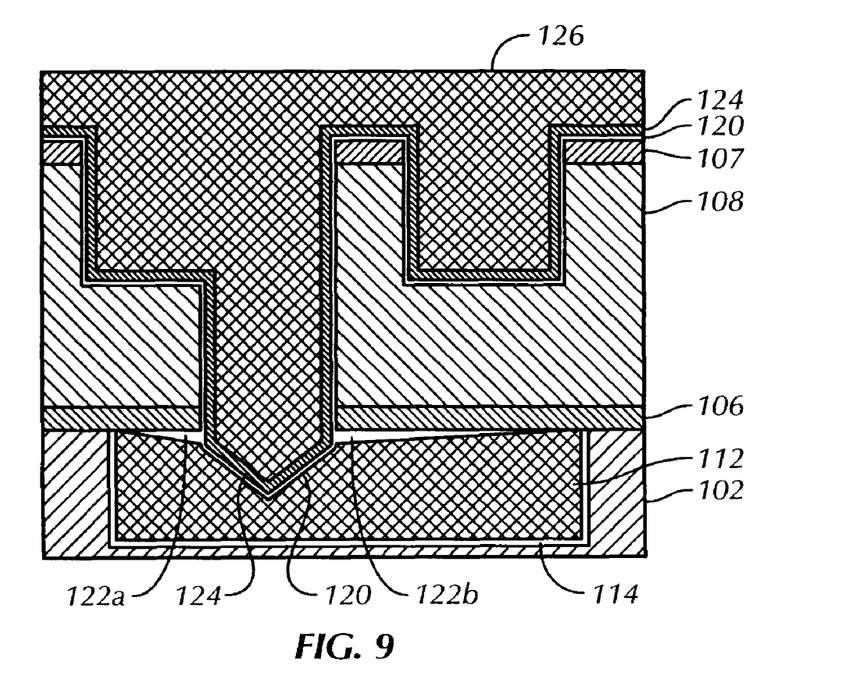

With reference to FIG. 9, a conductive metal 126 is deposited over the structure. Conductive metal 126 includes a material selected from a variety of metals including, for example, Cu, Al, Cu(Al), their alloys, and any suitable conductive material. In one embodiment, conductive metal 126 and conductive metal 112 include the same conductive material.

Figure 10:
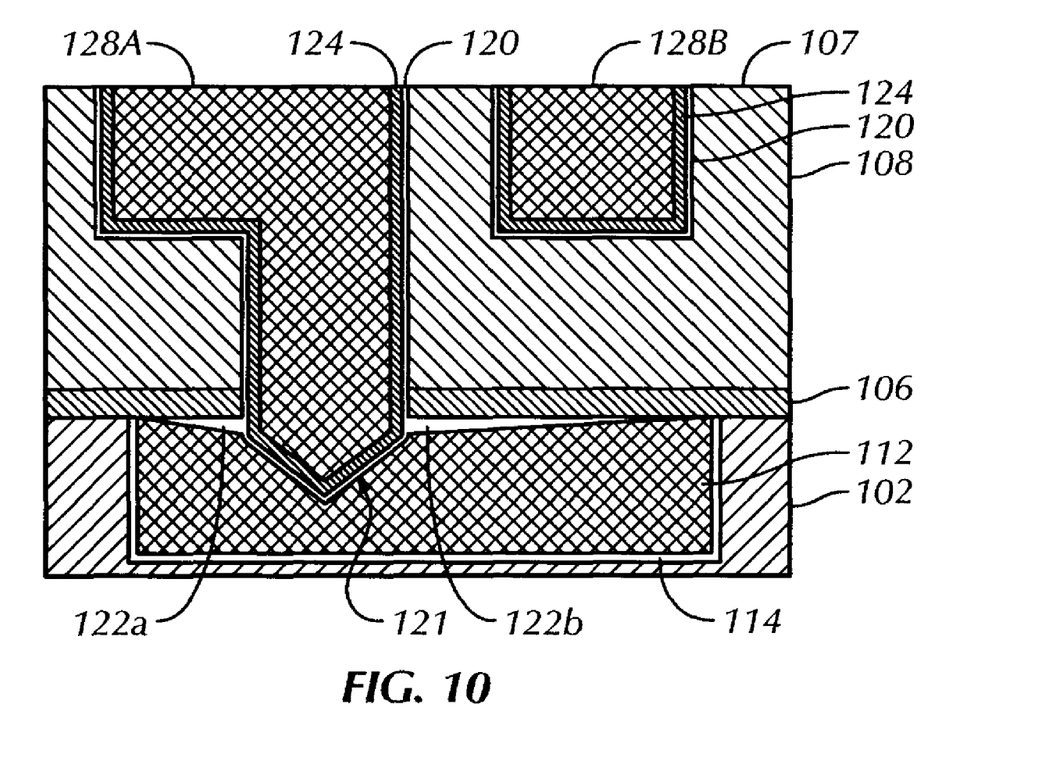

With reference to FIG. 10, a chemical mechanical planarization (CMP) is performed to remove any excess material from the surface of the structure, including hard mask 107, to form damascene lines 128A and 128B, wherein dual damascene line 128A includes a contact via extending through second dielectric layer 108 and dielectric capping layer 106 for connecting with interconnect element 104. Metal cap 121 is embedded therebetween with overhang portions 122a and 122b formed between interconnect element 104 and dielectric capping layer 106.

Figure 11:
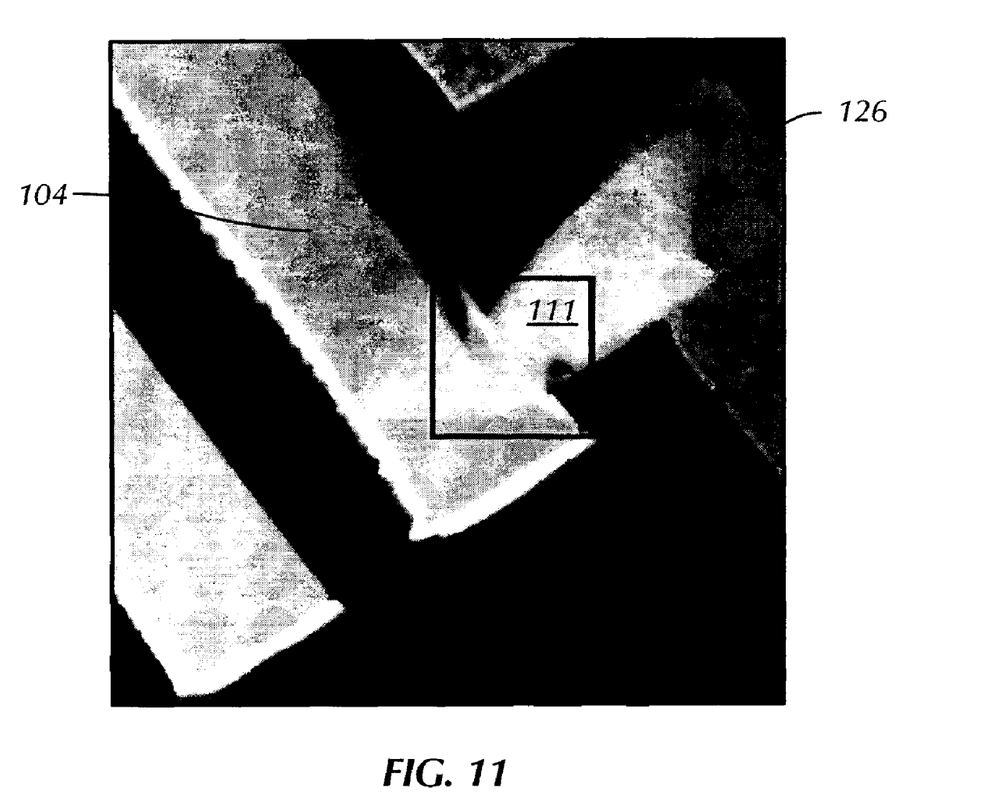
FIGS. 11 and 12 illustrate a transmission electron microscopic (TEM) photograph of an interconnect structure in accordance with the present disclosure.
Figure 12:
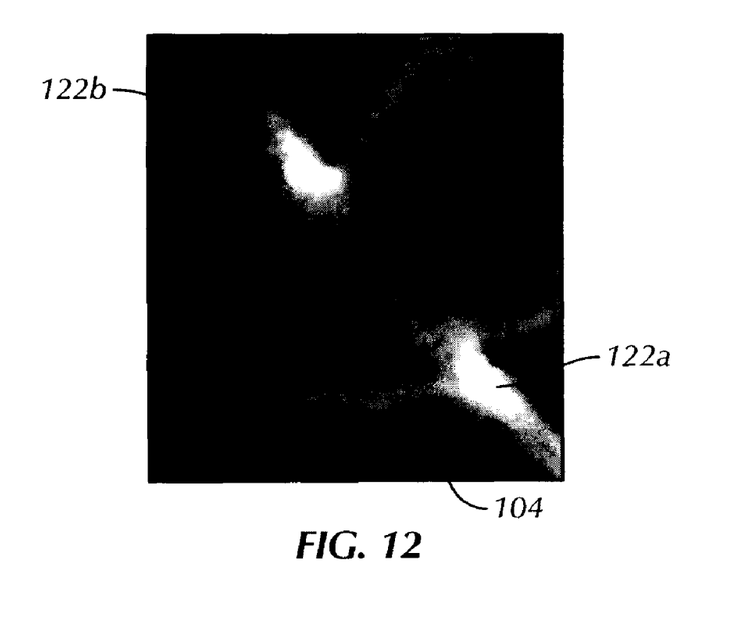

FIGS. 11 and 12 illustrate a transmission electron microscopic (TEM) photograph of a metal cap formed in the interconnect structure, in accordance with the present disclosure. The real experimental TEM image shown in FIG. 11 demonstrates the structure illustrated by FIG. 10. In particular, FIG. 12 shows a chemical mapping from the via gauging feature 116 in FIG. 11. In addition, FIG. 12 shows that good Ru fill into undercut areas 118a and 118b (FIG. 7) and creates metal cap 121 on top of conductive metal 112 of interconnect element 104.

Figure 13:
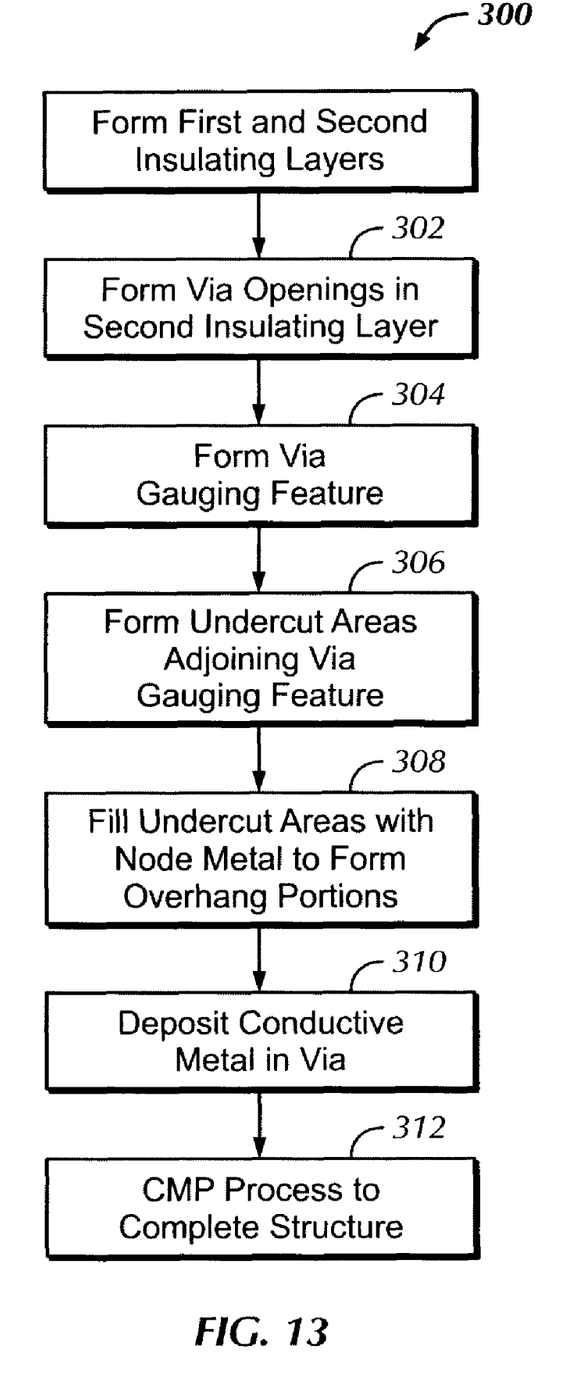
FIG. 13 is an exemplary flow diagram illustrating a method of forming an interconnect structure, in accordance with one embodiment of the present disclosure.

With reference to FIG. 13, in conjunction with FIGS. 4-10, a flow diagram of an exemplary interconnect structure with metal cap embedded therewithin, in accordance with the present disclosure, is illustrated. Initially, at step 300, an interconnect structure 100 is formed including a first insulating layer 102 formed on a base semiconductor substrate and having therewithin an interconnect element 104, a dielectric capping layer 106 formed over first insulating layer 102 and a second insulating layer 108 formed over dielectric capping layer 106, as discussed hereinabove. In accordance with the present disclosure, at step 302, interconnect openings 110A and 110B are formed in second insulating layer 108, where interconnect opening 110A includes a contact opening 111 for exposing a portion of interconnect element 104. At step 304, via gauging feature 116 is formed in the exposed portion of interconnect element 104. At step 306, an isotropic wet/dry etching is performed using diluted acid to form undercut areas 118A and 118B adjoining via gauging feature 116. At step 308, undercut areas 118A and 118B are filled with a noble metal 120 to form portions 122A and 122B. A liner layer 124 is then formed over the structure. At step 310, a conductive metal 126 is deposited over the entire structure for forming damascene lines 128A and 128B. Finally, at step 312, a CMP is performed to remove any excess material.

The above described structure and method enables metal cap integration for enhancing electromigration resistance for VLSI and ULSI applications. In addition, the above described method is compatible with current manufacturing practices and thus cost-effective for high-value manufacturing. Also, the enhanced electromigration resistance from the above described metal cap/Cu interconnect structure offers more flexibility on advanced circuit design with higher current density for further performance improvement.

It will be understood that numerous modifications and changes in form and detail may be made to the embodiments of the presently disclosed structure and method of forming an improved metal cap for interconnect structures. It is contemplated that numerous other configuration of the interconnect structure may be formed, and the material of the structure and method may be selected from numerous materials other than those specifically disclosed. Therefore, the above description should not be construed as limiting the disclosed structure and method, but merely as exemplification of the various embodiments thereof. Those skilled in the art will envisioned numerous modifications within the scope of the present disclosure as defined by the claims appended hereto. Having thus complied with the details and particularity required by the patent laws, what is claimed and desired protected is set forth in the appended claims.

What is claimed is:

1. A method of fabricating an interconnect structure, the method comprising:
    forming an interconnect feature in an upper portion of a first insulating layer;
    deposing a dielectric capping layer over said interconnect feature and said first insulating layer;
    depositing a second insulating layer over said dielectric capping layer;
    etching a portion of said second insulating layer to form at least one via opening, wherein said at least one via opening exposes a portion of said interconnect feature;
    bombarding said portion of said interconnect feature for defining a gauging feature in a portion of said interconnect feature;
    etching said via gauging feature for forming at least one undercut area adjacent to said interconnect feature and said dielectric capping layer;
    depositing a noble metal layer, said noble metal layer filling said at least one undercut area of said via gauging feature to form a metal cap;
    depositing a metal layer over said metal cap; and
    wherein said at least one etched undercut feature extends alone an entire surface of said interconnect feature.

2. The method of fabricating an interconnect structure as recited in claim 1, wherein said depositing a metal layer forms a dual damascene structure over said metal cap.

3. The method of fabricating an interconnect structure as recited in claim 1, wherein said bombarding includes a gaseous physical bombardment.

4. The method of fabricating an interconnect structure as recited in claim 3, wherein said gaseous physical bombardment includes an Argon bombardment.

5. The method of fabricating an interconnect structure as recited in claim 1, wherein said via gauging feature includes a plurality of opposing planes extending into said interconnect feature.

6. The method of fabricating an interconnect structure as recited in claim 1, wherein said at least one undercut area is formed by conducting an isotropic etching process.

7. The method of fabricating an interconnect structure as recited in claim 1, wherein said at least one etched undercut area extends along a portion of said interconnect feature.

8. The method of forming an interconnect structure as recited in claim 1, wherein said at least one etched undercut feature extends along an entire surface of said interconnect feature.

9. The method of fabricating an interconnect structure as recited in claim 1, wherein said metal cap protrudes between said interconnect feature and said dielectric capping layer.

10. The method of fabricating an interconnect structure as recited in claim 1, wherein said noble metal layer is selected from a group consisting of Ru, Ir, Rh, Pt and alloys thereof.

11. The method of fabricating an interconnect structure as recited in claim 1, wherein said interconnect feature includes a conductive metal selected from a group consisting of Cu, Al, W and alloys thereof.

12. The method of fabricating an interconnect structure as recited in claim 1,
 wherein said first insulating layer includes a dielectric layer;
 wherein said dielectric layer includes a dielectric constant of at most 4.0; and
 wherein said dielectric layer includes a thickness ranging from about 200 nm to about 450 nm.

13. The method of fabricating an interconnect structure as recited in claim 1,
 wherein said second insulating layer includes a dielectric layer;
 wherein said dielectric layer includes a dielectric constant of at most 4.0; and
 wherein said dielectric layer includes a thickness ranging from about 200 nm to about 450 nm.

* * * * *